(12) United States Patent
Murakami et al.

(10) Patent No.: US 7,211,949 B2
(45) Date of Patent: *May 1, 2007

(54) ORGANIC LIGHT-EMITTING DISPLAY DEVICE

(75) Inventors: Hajime Murakami, Tokyo (JP); Yoshiro Mikami, Tokyo (JP); Etsuko Nishimura, Tokyo (JP); Shingo Ishihara, Tokyo (JP); Masao Shimizu, Tokyo (JP); Kenichi Onisawa, Tokyo (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/439,734

(22) Filed: May 23, 2006

(65) Prior Publication Data

US 2006/0220582 A1 Oct. 5, 2006

Related U.S. Application Data

(63) Continuation of application No. 11/090,394, filed on Mar. 25, 2005, now Pat. No. 7,067,973, which is a continuation of application No. 10/653,313, filed on Sep. 2, 2003, now Pat. No. 6,882,105.

(30) Foreign Application Priority Data

Dec. 11, 2002 (JP) ............................. 2002-359430

(51) Int. Cl.
*H05B 33/00* (2006.01)

(52) U.S. Cl. .................. 313/506; 313/504; 315/169.3

(58) Field of Classification Search ........ 313/503–506, 313/512; 315/169.3; 345/36, 34, 76; 257/40
See application file for complete search history.

(56) References Cited

U.S. PATENT DOCUMENTS

| | | | |
|---|---|---|---|
| 6,046,547 A | 4/2000 | Nishio et al. | 315/169.3 |
| 6,072,450 A | 6/2000 | Yamada et al. | 345/76 |
| 6,084,579 A | 7/2000 | Hirano | 345/205 |
| 6,538,374 B2 | 3/2003 | Hosokawa et al. | |
| 6,882,105 B2 | 4/2005 | Murakami et al. | 313/506 |
| 6,894,432 B2 * | 5/2005 | Fujieda et al. | 313/506 |
| 2003/0111966 A1 | 6/2003 | Mikami et al. | 315/169.3 |
| 2004/0070808 A1 | 4/2004 | Nakanishi | |

FOREIGN PATENT DOCUMENTS

JP 10-189252 7/1998

* cited by examiner

*Primary Examiner*—Ashok Patel
(74) *Attorney, Agent, or Firm*—Hogan & Hartson LLP

(57) ABSTRACT

The present invention provides OLEDs of the top emission type comprising organic light-emitting (LE) elements by preventing the problems such as the widening of the power lines, the reduction in the aperture ratio caused by the widening of the upper and the lower capacitor electrodes and the short circuit between the upper and the lower electrodes caused by the roughness of the flattening layers. Two kinds of the OLEDs are provided. One is an OLED comprising a region of LE layer sandwiched between the upper and lower electrodes is formed on a power line of TFT for driving the pixel. Another comprises a region of the LE layer formed on an electrode of capacitor connected to the TFTs to control the light-emitting element. Accordingly, without forming a flattening layer on the light-emitting layer, there is no electric short circuit between the lower electrode and the upper electrode.

5 Claims, 6 Drawing Sheets

ORGANIC LIGHT-EMITTING DISPLAY DEVICE

CROSS-REFERENCE TO THE RELATED APPLICATIONS

This is a continuation of application Ser. No. 11/090.394 filed Mar. 25, 2005, now U.S. Pat. No. 7,067,973 which is a continuation of application Ser. No. 10/653,313 filed Sep. 2, 2003, now a U.S. Pat. No. 6,882,105, the entire contents of all are incorporated by reference. This application also claims benefit of priority under 35 USC § 119 to Japanese Patent Application No. 2002-359430 filed Dec. 11, 2002, the entire contents of which are incorporated by reference.

BACKGROUND OF THE INVENTION

1. Field of the Invention

The present invention relates to an organic light-emitting display device. More specifically, the present invention relates to an organic light-emitting display device which can prevent short circuit between two electrodes driving an organic light-emitting element in a light-emitting element due to the surface roughness of the substrate and provide an improved aperture ratio.

2. Description of the Related Art

As real multi-media era is coming up, flat panel displays (hereinafter, abbreviated to FPDs) used as a man-machine interface are being widely noticed. Conventionally, liquid crystal displays (hereinafter, abbreviated to LCDs) have been used as the FPDs. However, the LCDs have drawbacks such as their slow response and a narrow viewing angle compared with CRT displays.

Recently, as one of the next generation FPDs, display devices using organic light-emitting devices have attracted a great deal of attention. The device using the organic light-emitting device (hereinafter abbreviated to OLED) has superior properties such as spontaneous light emission, wider viewing angle, faster response speed and the like. Conventional structure of OLED is based on a stack of a first electrode preferably formed on glass, an organic light-emitting layer comprising a hole transport layer, a light-emitting layer and an electron transport layer formed on the first electrode, and a second electrode as an upper electrode with a low work function formed on the organic light-emitting layer. Then, by applying a voltage of several volts between the first and the second electrodes, holes and electrons are injected into the hole transport layer and the electron transport layer, respectively. Next, excitons are formed in the light-emitting layer where the holes and the electrons are combined. Finally, light is emitted from the light-emitting layer when the excitons formed return to their ground states. In the case of a so-called bottom emission type using the first electrode which is transparent, the emitted light passes the first electrode and is taken out from the back of the substrate.

Display devices using OLEDs are classified into two groups. One is the OLED of a simple matrix type and another is the OLED of an active matrix type. In the case of the simple matrix type, organic layers, comprising hole transport layers, light-emitting layers and electron transport layers, are formed on the positions where a plurality of anode lines (or anode wirings) and cathode lines (or cathode wirings) cross each other. Each pixel is lit up only for a preset period during one frame. The preset period is the time interval of the one frame divided by the number of the anode lines. The OLED of the simple matrix type has an advantage of its simpler structure.

However, in the case of the simple matrix type, if the number of pixels increases, the preset period should become shorter. Therefore, to achieve a required value for averaged luminance, it is necessary to increase the luminance of the pixel during the preset period. In this case, it causes a problem of a shortened life of the OLED. Furthermore, particularly for a large display-panel of OLED, as the OLED is driven by DC, non-uniform potential is applied to each pixel because of the potential drop due to elongated lengths of the anode and cathode lines. As a result, non-uniform luminance is generated over the entire display area. Therefore, qualities in terms of high definition of the pictures and scaling-up of the display size are limited for the simple matrix type.

On the other hand, in the case of an OLED of an active matrix type, each organic light-emitting element comprising each pixel is connected to an element driving circuit (or a pixel driver) comprising 2 to 4 switching elements such as thin film transistor (hereinafter abbreviated to TFT) and capacitors. Also, power lines are formed to supply current to each light-emitting element and thereby all pixels can be simultaneously operated during the period of one frame. Thus, it is not necessary to increase the luminance of the pixels all together and their lives can be elongated. From these reasons, to achieve high definition of pictures and scaling-up (or large display size), the OLED of the active matrix type has an advantage over other types of the OLEDs. Hereinafter, TFTs are used for the switching elements but other active elements can be used instead.

The OLED of the active matrix type which emits light from the back of the substrate is called "bottom emission type". In the OLED of this type, as the pixel driving elements are installed between the substrate and organic light-emitting elements, as the pixel driving elements obstruct the light emitted from the light-emitting elements and aperture ratio is restricted. Particularly, in the case of large area displays, widths of power lines are widened to reduce the non-uniformity of the luminance of pixels due to potential drop along the power lines, which brings a problem that the aperture ratio of the display becomes smaller. Additionally, if the capacitances of the capacitors are increased to preserve the bias and signal voltages of the transistors to drive the OLED, the area of the capacitor electrodes increases, which accordingly causes a problem that the aperture ratio becomes extremely small.

To solve above problems, efforts to emit the light from the upper electrode using transparent electrode are being made. The OLED with the structure of light emission from the upper electrode is called "a top emission type". However, in the structure of the top emission type, light-emitting units of OLED are formed on the TFTs, capacitor electrodes or wirings, which causes a problem of a short circuit between the bottom and the upper electrode. It is because the organic light-emitting layer which forms a light-emitting unit and is very thin (about 50–200 nm) can not cover the surface roughness of its underlying layer. This is one of the problems to be sorted out.

To solve this problem, an OLED using a polyimide film as a flattening layer to reduce the surface roughness of its underlying layer was disclosed in JP-A No. 10-189252, which is incorporated herein by reference. FIG. 11 illustrates a sectional view of a structure of a pixel region in the conventional OLED showing the flattening layer formed on its underlying layer. Referring to FIG. 11, a gate insulating film 117 covering a lower capacitor electrode 105 and an upper capacitor electrode 108 are formed on a glass substrate 116. A capacitor which consists of a stack of the lower capacitor electrode 105, the gate insulating film 117 and the upper capacitor electrode 108 is formed.

A 1st insulating interlayer 118 is formed on the stack of the capacitor. On the capacitor, a power line 110 is formed and connected to the upper capacitor electrode 108. Here, a signal line 109 is formed simultaneously. A 2nd insulating interlayer 119 is formed covering the power line 110 and the signal line 109. The flattening layer 136 is formed on the 2nd insulating interlayer 119 and provides a flat surface for a deposition of a lower electrode 115 to form an organic light-emitting element. Reference numeral 120 denotes a 3rd insulating interlayer 120 which prescribes a region of a light-emitting unit 135. Reference numeral 126 denotes a protective layer.

FIG. 12 shows a schematic equivalent circuit diagram of a driving circuit for the organic light-emitting element in the OLED shown in FIG. 11. The same reference numerals shown in FIG. 11 are correspondingly numbered in FIG. 12. Referring to FIG. 12, one pixel consists of an organic light-emitting element 100, a 1st TFT 101 connected to a scanning line 106 and a signal line 109, a 2nd TFT 102 connected to a power line 110 and a capacitor 104. The scanning line 106 selects the TFT 101 and a signal (i.e. data to be displayed) from the signal line 109 is stored in the capacitor 104. Based on the signal stored in the capacitor 104, the 2nd TFT 102 provides a current from the power line 110 for the organic light-emitting element 100 and then the organic light-emitting element 100 emits light.

Therefore, in the conventional OLED, the surface roughness of the lower capacitor electrode 105 and the upper electrode for the capacitor 108 and steps formed by the power line 110 and the signal line 109 can not be eliminated by the 2nd insulating interlayer 119. Accordingly, a thick flattening layer 136 must be formed to flatten the light-emitting unit 135 consisting of the lower electrode 115, an electron injection layer 124, an electron transport layer 123, a light-emitting layer 122, a hole transport layer 121 and the upper electrode 125. However, to introduce the above flattening layer 136, it requires additional processes such as a spin coating, a baking process, a patterning process using a photolithography, etc., which degrades the reliability of the total process.

In short, based on the prior art, the structure of the OLED of the top emission type is required to ensure a high aperture ratio. Accordingly, the flattening layer 136 with thickness of several μm is necessary to avoid a short circuit between the lower electrode 115 and the upper electrode 125 herewith, where the short circuit is caused by the surface roughness originated from the underlying layers comprising the TFT, wirings, etc.

Thus, a purpose of the present invention is to provide an OLED of the top emission type comprising organic light emitting elements by preventing the previous problems such as the widening of the power lines, the reduction in the aperture ratio caused by the widening of the upper and the lower capacitor electrodes and the short circuit between the upper and the lower electrodes caused by the roughness of the flattening layers.

SUMMARY OF THE INVENTION

The present invention provides an organic light-emitting display device comprising a plurality of pixels having organic light-emitting elements which comprise organic light-emitting layers sandwiched between upper and lower electrodes, wherein light emitted from the organic layer is taken out from the side of the upper electrode and, in each pixel, a region of light-emitting layer substantially sandwiched between the upper and lower electrodes is formed on a power line of TFT for driving the pixel.

The present invention provides another organic light-emitting display device comprising a plurality of pixels having organic light-emitting elements which comprise organic light-emitting layers sandwiched between upper and lower electrodes, wherein light emitted from the organic layer is taken out from the side of the upper electrode and, in each pixel, the region of light-emitting layer substantially sandwiched between the upper and lower electrodes is formed on the electrode forming a capacitor connected to the TFT for driving the pixel.

In an organic light-emitting device of the present invention, basically, a pixel driving unit for actively driving pixels comprises a circuit of 2–4 pieces of TFTs and capacitors. However, the number of the TFTs is not restricted to the number 2–4 but it may be more than 4. Also, structures of the TFTs used in a circuit of a pixel driving unit for actively driving can be a coplanar type, an inverted-stagger type or a normal stagger type. Here, the capacitors have two kinds of functions. One is to hold a bias voltage of the TFTs for actively driving. Another is to hold a signal voltage. The electrodes to functionalize the capacitors can be lower capacitor electrodes or upper capacitor electrodes. Preferably, the electrodes to functionalize the capacitors are the upper capacitor electrodes to enlarge the aperture ratio effectively. Two kinds of TFTs are incorporated consisting of the TFTs to control the signals for the display and the TFTs to drive the pixels based on the signals.

To fabricate an organic light-emitting display device of the present invention, preferably, an upper electrode is at least one of the components selected from a group of transparent conductive oxides, transparent metal thin films and organic conductive films. In the present specification, the description "pixel" means minimum unit, a plurality of which are arranged on a screen of an organic light-emitting device to display characters or graphics. In the case of a full-color display, each pixel consists of sub-pixels of three colors, namely, green, red and blue.

There are two different structures suitable for the fabrication of the organic light-emitting devices. One is the structure where a lower electrode is an anode and an upper electrode is a cathode. In this structure, a first injection layer and a first transport layer serve as, a hole injection layer and a hole transport layer, respectively. Then, a second injection layer and a second transport layer serve as an electron injection layer and an electron transport layer, respectively. Another structure comprises the lower electrode as a cathode and the upper electrode as an anode. In this structure, a first injection layer and a first transport layer serve as an electron injection layer and an electron transport layer, respectively. Then, a second hole layer and a second transport layer serve as a hole injection layer and a hole transport layer, respectively. In these two kinds of structures, it is possible to delete the first injection layer or the second injection layer. Additionally, the first transport layer or the second transport layer may serve as the light-emitting layer.

An anode is preferably composed of a conductive film with a large work function to enhance an injection rate of the holes. The anode can be formed of, for example, Au, Pt, etc but it is not restricted to them. Materials selected from the group of transparent conductive oxides such as $In_2O_3$—$SnO_2$ and $In_2O_3$—$ZnO$ can be also used for the anode. These transparent conductive oxide films can be deposited using conventional sputtering, EB-evaporation, ion-plating and the like.

Work functions of $In_2O_3$—$SnO_2$ and $In_2O_3$—$ZnO$ films are both about 4.6 eV which can be increased to 5.2 eV by a UV irradiation or a plasma treatment using oxygen. In the case of $In_2O_3$—$SnO_2$ films, these films become poly-crystalline when they are deposited at a substrate temperature about 200° C. However, as the poly-crystalline states yield different etching rates in grains and grain boundaries of those films, amorphous states are preferred when they are to be used for the lower electrodes.

When an anode is used with the hole injection layer, the materials with lager work functions are not required to form the anode and it is possible to use ordinary conductive films such as metals including Al, In, Mo, Ni and Cr, their alloys and inorganic materials such as poly-Si, amorphous-Si, tin oxides, indium oxides and indium-tin oxides (ITO). Also, organic materials and conductive inks comprising polyaniline, polythiophene, etc, can be used and formed by a conventional coating process suitably selected. Materials for the anode are not restricted to those described above and simultaneous use of two or more materials may be effective.

As a hole injection layer, materials having suitable ionization potentials are preferably selected to reduce the injection barrier between the anode and the hole transport layers. The hole transport layer is formed preferably to fill up the roughness of the underlying layer. The hole injection layer can be selected from the group consisting of, for example, Cu-phthalocyanines, star-burst amine compounds, polyanilines, polythiophenes, vanadium oxides, molybdenum oxides, ruthenium oxides, aluminum oxides, etc but it is not restricted to them.

A hole transport layer is formed to transport and inject holes into the light-emitting layer. For that purpose, the hole transport layer is preferably selected from the group of materials which have higher hole mobility and are chemically stable. Additionally, the hole transport layer is preferably selected from the group of materials which have lower electron affinity and higher glass transition temperature. For these purposes, the hole transport layer is preferably formed of, for example, N,N'-bis(3-methylphenyl)-N,N'-diphenyl-[1,1'-biphenyl]-4,4'diamine (TPD), 4,4'-bis[N-(1-naphthyl)-N-phenylamino]biphenyl (α-NPD), 4,4',4"-tri (N-carbazolyl)triphenylamine (TCTA), 1,3,5-tris[N-(4-diphenylaminophenyl)phenylamino]benzene (p-DPA-TDAB) but it is not restricted to them and simultaneous use of two or more materials is possible.

A light-emitting layer is a layer where injected holes and electrons recombine and emit light at wavelengths intrinsic to the materials used. There are two cases for the light emission. One is the case that the host material comprising the light-emitting layer emits light. Another is that a small quantity of dopant material itself doped in the host material emits light. As heterothallic host materials, the following materials can be used preferably: distylylarylene derivatives (DPVBi), silole derivatives with benzene skelton (2PSP), oxodiazole derivatives with triphenylamine on both ends (EM2), perynone derivative with phenanthrene group (P1), oligothiophene derivatives with triphenylamine structures on both ends (BMA-3T), perylene derivatives (tBu-PTC), tris (quinolinol) aluminum, poly-paraphenylene-vinylene derivatives, polythiophene derivatives, poly-paraphenylene derivatives, polisilane derivatives, polyacetylene derivarives. Materials which can be used for this purpose are not restricted to those listed above and two or more of them can be simultaneously used.

Next, as a dopant material, the following can be used preferably: quinacridone, coumarin 6, Nile red, rubrene, 4-(dicyanomethylene)-2-methyl-6-(para-dimethylaminostyryl)-4H-pyran (DCM), dicarbazole derivatives. Materials which can be used for this purpose are not restricted to those and two or more of them can be simultaneously used.

An electron transport layer transports electrons and inject them into the light-emitting layer. For this purpose, desirably it a has high electron mobility. For example, tris (8-quinolinol) aluminum, oxadiazole derivatives, silole derivatives, zinc-benzothiazole complexes are used favorably. It is not restricted to these materials and two or more of them may be used simultaneously.

An electron injection layer is used to enhance the efficiency of electron injection from the cathode to the electron transport layer. The following materials can be used preferably: lithium fluoride, magnesium fluoride, calcium fluoride, strontium fluoride, barium fluoride, magnesium oxide. Materials which can be used for this purpose are not restricted to those and two or more of them can be simultaneously used.

A conductive film with a low work function to enhance efficiency of electron injection is favorable for the cathode. Preferably, the following materials can be used: magnesium, silver alloys, aluminum, lithium alloys, aluminum-calcium alloys, aluminum-magnesium alloys, metallic calcium, cerium compounds, but it is not restricted to them.

If the electron injection layer is formed, it is not necessary to use a material with a low work function for the cathode. Instead, commonly used metal may be used for this purpose. Preferably, the following materials can be used: metals such as aluminum, indium, molybdenum, nickel, chromium, their alloys, poly-silicon, amorphous-silicon, etc.

When a cathode is used for an upper electrode, it is preferable to form an electron injection layer under the cathode. By forming an electron injection layer, it is possible to use transparent conductive films with large work functions. For example, transparent conductive films based on $In_2O_3$—$SnO_2$ or $In_2O_3$—$ZnO$ can be used. These transparent electrode materials can be fabricated using a sputtering, EB-evaporation, ion-plating method and the like.

A protective layer is formed on the upper electrode to prevent $H_2O$ and $O_2$ in the atmosphere from penetrating into the upper electrode or the underlying organic layers. For example the following materials are preferably used: inorganic materials such as $SiO_2$, $SiN_x$, $SiO_xN_y$, $Al_2O_3$, etc and organic materials such as polychloroprene, polyethylene terephthalate, polyoxymethylene, polyvinyl chloride, polyvinylidene fluoride, cyanoethyl pullulan, polymethyl methacrylate, polysulfone, polycarbonate, polyimide, etc. It is not restricted to those materials.

While the present invention has been particularly shown and described with reference to preferred methods and materials thereof, it will be understood by those of ordinary skill in the art that various changes in form and details may be made therein without departing from the spirit and scope of the present invention as defined by the appended claims.

BRIEF DESCRIPTION OF THE DRAWINGS

The above objects and advantages of the present invention will become more apparent by describing in detail exemplary embodiments thereof with reference to the attached drawings in which.

DETAILED DESCRIPTION OF THE INVENTION

Embodiments of organic light-emitting display device according to the present invention will be described with reference to the appended drawings.

Embodiment 1

Figure 1:
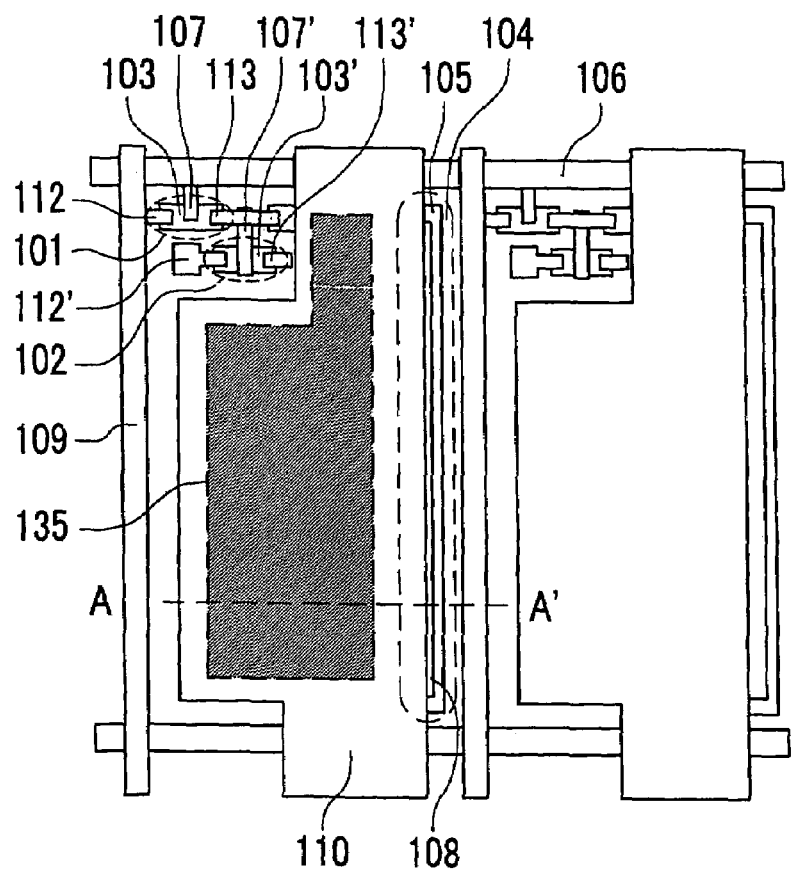
FIG. 1 is a plan view of a configuration of an OLED according to the embodiment 1 of the present invention.
Figure 2:
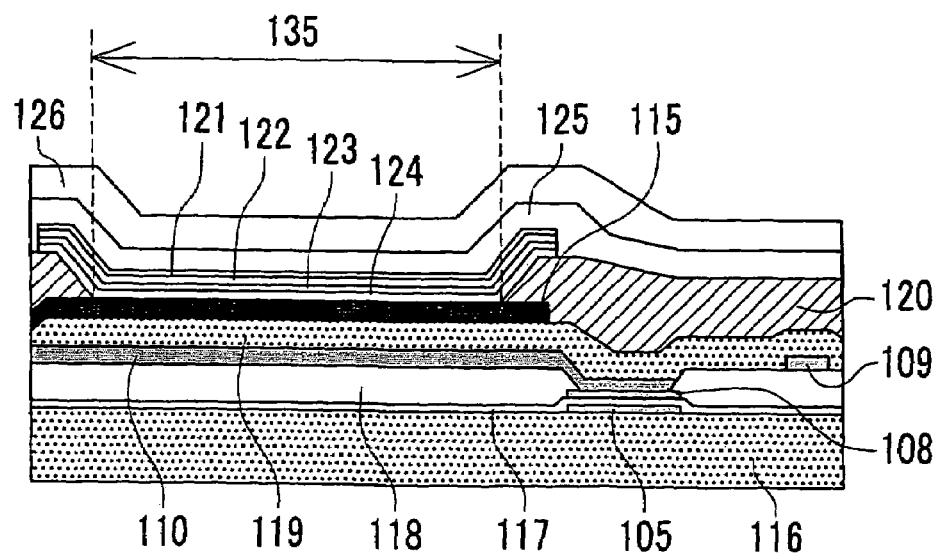
FIG. 2 is a sectional view of the light-emitting element taken along line A–A' of FIG. 1.

FIG. 1 is a plan view of a configuration of an OLED according to the embodiment 1 of the present invention. FIG. 2 is a sectional view of the light-emitting element taken along line A–A' of FIG. 1. The OLED shown in FIGS. 1 and 2 comprises plural light-emitting elements, each of which is arranged in a matrix and has an organic light-emitting element. The organic light-emitting element consists of an organic light-emitting layer 122 and an upper electrode 125 and a lower electrode 115 sandwiching the organic light-emitting layer 122. This organic light-emitting element is the type of the top emission where light is emitted from the organic light-emitting layer 122 and then the light is taken out from the upper electrode 125. Reference numerals 121, 123, 124 and 126 denote a hole transport layer, an electron transport layer, an electron injection layer and an protective layer, respectively.

In FIG. 1, reference numeral 101 denotes a 1st TFT. Reference numerals 112, 113, 103 and 107 relate to the 1st TFT and denote a source electrode, a drain electrode, an active layer consisting of a-Si and a gate electrode thereof, respectively. Reference numeral 102 denotes a 2nd TFT. Reference numerals 112', 113', 103' and 107' relate to the 2nd TFT and denote a source electrode, a drain electrode, an active layer consisting of a-Si and a gate electrode thereof, respectively. The 1st TFT 101 is a TFT (TFT for control) which controls the 2nd TFT (TFT for driving) driving the organic light-emitting element.

Reference numerals 104, 105, 108, 106, 109 and 110 denote a capacitor, a lower capacitor electrode, an upper capacitor electrode, a scan line, a signal line and a power line, respectively. Typical feature of the configurations of this embodiment is that a light-emitting unit 135, substantially an organic light-emitting element, is formed on the power line 110.

Hereinafter, a manufacturing method of the OLED according to the embodiment 1 of the present invention will be explained. First, amorphous silicon. (hereinafter, abbreviated to a-Si) with film thickness 50 nm is formed on a glass substrate 116 using LPCVD (Low Pressure CVD). Then the total area of the a-Si is laser-annealed and then the a-Si is crystallized to form poly-crystalline Si (hereinafter, abbreviated to p-Si). Next, by patterning the p-Si using dry etching, an active layer 103 for the 1st transistor 101, an active layer 103' for the 2nd transistor 102 and a lower capacitor electrode 105 are formed. After that, a gate insulating film 117 of $SiO_2$ with thickness 100 nm is formed by plasma enhanced chemical vapor deposition (hereinafter, abbreviated to PECVD).

Next, two gate electrodes 107 and 107' of TiW with thickness 50 nm for the two TFT's are formed using a sputtering and then patterned with prescribed patterns. Simultaneously to these processes, the scan line 106 and the upper capacitor electrode 108 are patterned, which is followed by forming a gate insulating film 117 over them. Next, P ions are injected into the patterned p-Si from the top of the gate insulating film 117 using an ion implantation. Here, the P ions are not injected to the region where the gate electrodes 107 and 107' are formed. Thereby, the active layer 103 and 103' are completed.

Next, the glass substrate 116 is activated in an inert atmosphere ($N_2$) by heating so that the doping can be effectively carried out on the glass substrate 116, a 1st insulating interlayer 118 of silicon nitride (SiNx) with thickness 200 nm is formed.

Next, a contact hole is formed in the gate insulating film 117 and the 1st insulating interlayer 118 on upper both ends of the active layers 103 and 103'. Furthermore, another contact hole is formed in the 1st insulating interlayer 118 on the upper side of the gate electrode 107' for the 2nd TFT. Here, the contact hole is described as disrupted state of the 1st insulating interlayer 118 as shown in FIG. 2. On the contact hole, Al film with thickness 500 nm is formed by a sputtering and then by a photolithographic process the signal line 109 and the power line 110 are formed. Then, the source electrode 112 and the drain electrode 113 for the 1st TFT, and the source electrode 112' and the drain electrode 113' for the 2nd TFT are formed.

Then, the lower capacitor electrode 105 and the drain electrode 113 of the 1st TFT 101 are connected. The source electrode 112 of 1st TFT 101 and the signal line 109, the drain electrode 113 of 1st TFT and the gate electrode 107' of 2nd TFT 102, and, the drain electrode 113' of 2nd TFT and the power line 110 are connected. Finally, the upper capacitor electrode 108 is connected to the power line 110.

Next, a 2nd insulating interlayer 119 of SiNx with thickness 500 nm is formed to cover the power line 110. The contact hole is formed on top of the source electrode 112' for the 2nd TFT. On the contact hole, using a sputtering, Al film with thickness 150 nm is formed and then the lower electrode 115 is formed by photolithography. Then, by a spin coat technique using, for example, a positive type of protective film of light sensitive resin (PC452, JSR Corporation), a 3rd insulating interlayer 120 is formed and baked. Preferably, the thickness of the 3rd insulating interlayer 120 consisting of the positive type light sensitive resin protective film (PC452) is 1 μm and is formed to cover the edge of the lower electrode 115 by about 3 μm.

FIG. 2 illustrates the cross section of the structure of the light-emitting element comprising of the organic the light-emitting element.

The glass substrate 116 with a stack up to the lower electrode 115 is ultrasonically cleaned with an acetone and pure water in this order each for three minutes. After the cleaning, the glass substrate 116 is spin-dried. Next, an electron injection layer 124 of LiF with thickness 0.5 nm is formed on the lower electrode 115 by a vacuum deposition method. During the formation of the electron injection layer 124, a shadow mask is used to form its pattern.

On the electron injection layer 124, a film of Alq (tris (8-quinolinol) aluminium) with thickness 20 nm is formed using a vacuum deposition method. This film of the Alq serves as an electron transport layer 123. During the formation of the electron transport layer 123, a shadow mask is used to form its pattern. On the electron transport layer 123, co-deposition of Alq(tris(8-quinolinol)aluminium) and quinacridone (Qc) with thickness 20 nm is performed by simultaneous vacuum deposition method with two sources. The co-deposited film of Alq and Qc serves as a light-emitting layer 122 and its pattern is formed using a shadow mask.

Next, a film of 4,4-bis[N-(1-naphtyl)-N-phenylamino] biphenyl (hereinafter, abbreviated to α-NPD) with thickness 50 nm is formed by a vacuum deposition method using a shadow mask for its patterning. Region of the deposition is 1.2 times each edge of the lower electrode 115. This film of the α-NPD serves as a hole transport layer 121.

Next, by a sputtering method, a film of In—Zn—O (hereinafter, abbreviated to IZO film) with thickness 50 nm is formed. This IZO film serves as an upper electrode 125 and is amorphous. As a target for the sputtering, a composition of In/(In+Zn)=0.83 is used for the target fabrication. Sputtering conditions of a vacuum pressure at 1 Pa with a mixed gas of Ar:$O_2$ and a sputtering power of 0.2 W/cm$^2$ are used. The upper electrode 125 consisting of In—Zn—O serves as an anode with transmittance over 80%. Next, by a sputtering method, a film of $Si_xN_y$ with thickness 50 nm is formed and serves as a protective layer 126.

As shown in FIG. 2, the OLED according to the embodiment 1 of the present invention comprises the light-emitting unit 135 consisting of the lower electrode 115 only formed on the flat portion of the power line 110, the organic light-emitting layer 122 and the upper electrode 125. Therefore, by fabricating this structure, without forming a flattening layer on the light-emitting layer, there is no electric short circuit between the lower electrode 115 and upper electrode 125 usually caused by the surface roughness of the stack.

Figure 3:
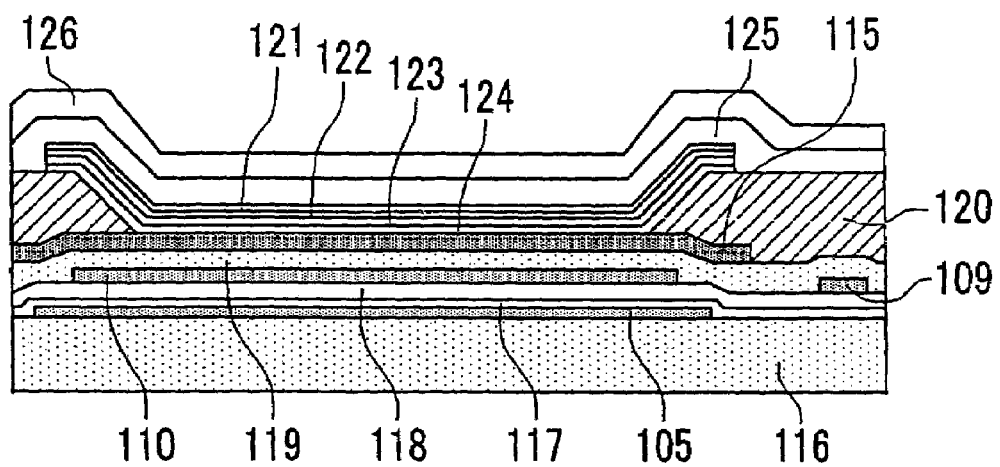
FIG. 3 shows a cross cut section of the region including a light-emitting element in OLED taken along line A–A' of FIG. 1, illustrating a modification of the OLED according to the embodiment 1 of the present invention.

FIG. 3 shows a cross cut section of the region including a light-emitting element in OLED taken along line A–A' of FIG. 1, illustrating a modification of the OLED according to the embodiment 1 of the present invention. In the structure of this OLED, an upper electrode 108 and a power line 110 are commonly used. Using this structure, capacitance can be enhanced. Other advantageous effects are the same as those of the embodiment 1 explained for the FIGS. 1 and 2.

Figure 4:
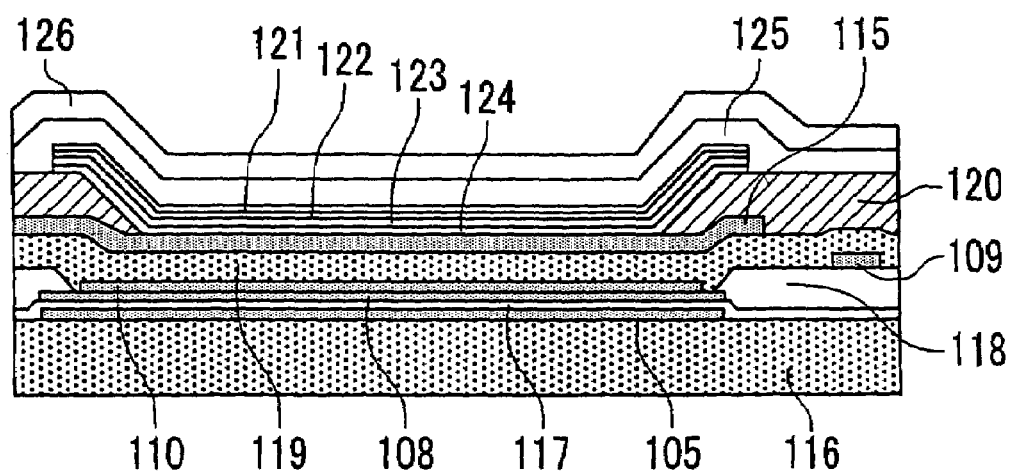
FIG. 4 shows a cross cut section of the region including light-emitting element in OLED taken along line A–A' of FIG. 1, illustrating another modification of the OLED according to the embodiment 1 of the present invention.

FIG. 4 shows a cross cut section of the region including light-emitting element in OLED taken along line A–A' of FIG. 1, illustrating another modification of the OLED according to the embodiment 1 of the present invention. In the structure of this OLED, a lower capacitor electrode 105 and an upper capacitor electrode 108 are widened under a power line 110. Using this structure, capacitance can be enhanced more than that shown in FIG. 3. Other advantageous effects are the same as those of the embodiment 1 explained for the FIGS. 1 and 2.

Embodiment 2

Figure 5:
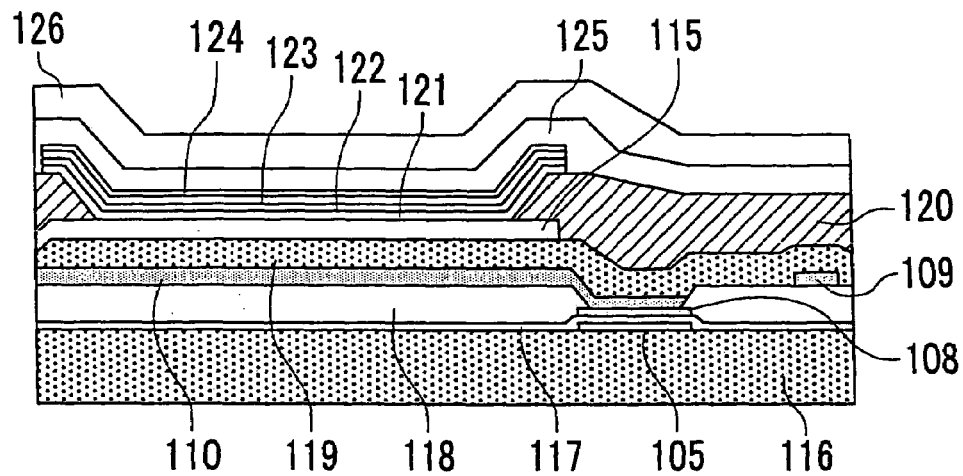
FIG. 5 shows a cross cut section of the region including a light-emitting element in OLED taken along line A–A' of FIG. 1, according to the embodiment 2 of the present invention.

Now, an OLED using an upper electrode as a cathode will be explained below. FIG. 5 shows a cross cut section of the region including a light-emitting element in OLED taken along line A–A' of FIG. 1, according to the embodiment 2 of the present invention. The OLED of the embodiment 2 comprises an upper electrode 125 as a cathode and a lower electrode 115 as an anode, which is different from the structure of the previous embodiment 1. Hereinafter, the manufacturing method in the embodiment 2 will be explained.

First, amorphous silicon (a-Si) with film thickness 50 nm is formed on a glass substrate 116 using LPCVD (Low Pressure CVD). Then the total area of the a-Si is laser-annealed and the a-Si is crystallized to form a poly-crystalline Si (p-Si). Next, by patterning the p-Si using a dry etching, an active layer 103 for a 1st transistor 101, an active layer 103' for a 2nd transistor 102 and a lower capacitor electrode 105 are formed.

After that, a gate insulating film 117 of $SiO_2$ with thickness 100 nm is formed. The $SiO_2$ film is formed by a PECVD using tetraethoxysilane (TEOS) as a source. Next, gate electrodes 107 and 107' of TiW with thickness 50 nm for the corresponding TFT's are formed using a sputtering and then patterned with prescribed patterns. Simultaneously to this process, a scan line 106 and an upper capacitor electrode 108 are patterned.

Next, ions of P and B are injected into the gate insulating films 117 and 117' to make the 1st TFT n-type and the 2nd TFT p-type, respectively. After that, the glass substrate 116 is activated in an inert atmosphere ($N_2$) by heating so that the doping can be effectively carried out. On the glass substrate 116, a 1st insulating interlayer 118 of silicon nitride ($SiN_x$) with thickness 200 nm is formed.

Next, contact holes are formed in the gate insulating film 117 and 1st insulating interlayer 118 on upper both ends of the active layers 103 and 103'. Furthermore, an additional contact hole is formed in the 1st insulating interlayer 118 on the upper side of the gate electrode 107' for the 2nd TFT. Here, the contact hole is described as disrupted state of the 1st insulating interlayer 118 as shown in FIG. 5. On the contact hole, Al film with 500 nm is formed by a sputtering and then by photolithographic process a signal line 109 and a power line 110 are formed. Then, a source electrode 112 and a drain electrode 113 for the 1st TFT, and a source electrode 112' and a drain electrode 113' for the 2nd TFT are formed.

Then, the lower capacitor electrode 105 and the drain electrode 113 of the 1st TFT 101 are connected. The source electrode 112 of the 1st TFT 101 and the signal line 109, the drain electrode 113 of the 1st TFT and the gate electrode 107' of the 2nd TFT 102, and, the drain electrode 113' of the 2nd TFT and the power line 110 are connected. Finally, the upper capacitor electrode 108 is connected to the power line 110.

The 2nd insulating interlayer 119 of SiNx with thickness 500 nm is formed to cover the power line 110. A contact hole is formed on top of the source electrode 112' for the 2nd TFT.

On the contact hole, using sputtering, ITO film with thickness 150 nm is formed and then a lower electrode 115 is formed by photolithography.

Next, by a spin coat using, for example, a positive type of protective film of light sensitive resin (PC452, JSR Corporation), a 3rd insulating interlayer 120 is formed and baked. Preferably, the thickness of the 3rd insulating interlayer 120 consisting of the positive type light sensitive resin protective film (PC452) is 1 µm and is formed to cover the edge of the lower electrode 115 by about 3 µm.

Next, a fabrication method of the light-emitting element comprising of the organic the light-emitting element will be explained.

The glass substrate 116 with a stack up to the lower electrode 115 is ultrasonically cleaned with an acetone and pure water in this order each for three minutes. After cleaning, the glass substrate 116 is spin-dried and oven-dried at 120° C. for 30 minutes. On the lower electrode 115, a film of 4,4-bis[N-(1-naphtyl)-N-phenylamino]biphenyl (α-NPD) with thickness 50 nm is formed by a vacuum deposition method using a shadow mask for its pattern. Region of the deposition is 1.2 times each edge of the lower electrode 115. This film of the α-NPD serves as a hole transport layer 121.

On the hole transport layer 121, co-deposition of Alq (tris(8-quinolinol)aluminium) and quinacridone (Qc) with thickness 20 nm is performed by a simultaneous vacuum deposition method with two sources. The co-deposition is carried out by controlling each deposition rate at a ratio of Alq to Qc=40:1. Its pattern is formed using a shadow mask. The co-deposited film of Alq+Qc serves as a light-emitting layer 122. Then Alq with thickness 20 nm is deposited on the light-emitting layer 122 using a vacuum deposition method using a shadow mask to form its pattern. This film of Alq serves as an electron transport layer 123.

On the electron transport layer 123, an alloy film of Mg and Ag is formed as an electron injection layer 124. This film is deposited using a simultaneous vacuum deposition method with two sources. A deposition rate of Mg to Ag is controlled at 14:1 and the thickness is 10 nm. A shadow mask is used for its patterning.

Next by a sputtering method, a film of In—Zn—O (hereinafter, abbreviated to IZO film) with thickness 50 nm is formed. This IZO film serves as an upper electrode 125 and is amorphous. As a target for the sputtering, a composition of In/(In+Zn)=0.83 is used for the fabrication of the target. Sputtering conditions of a vacuum pressure at 1 Pa with mixed gas of Ar:$O_2$ and a sputtering power of 0.2 W/cm$^2$ are used. The upper electrode 125 consisting of Mg:Ag/In—Zn—O serves as a cathode with transmittance 70%. Next, by a sputtering method, a film of $Si_xN_y$ with thickness 50 nm is formed and serves as a protective layer 126.

The OLED according to the embodiment 2 has the lower electrode 115 which is transparent. The emitted light passing toward the glass substrate 116 is reflected by the power line 110 and is taken out from the protective layer 126, which improves the efficiency of the light emission.

The OLED according to the embodiment 2 of the present invention comprises the light-emitting unit 135 consisting of the lower electrode 115 formed only on the flat portion of the power line 110, the organic light-emitting layer 122 and the upper electrode 125. Therefore, by fabricating this structure, without forming a flattening layer on the light-emitting layer, there is no electric short circuit between the lower electrode 115 and the upper electrode 125, while the short circuit is usually caused by the surface roughness of the stack.

Embodiment 3

Figure 6:
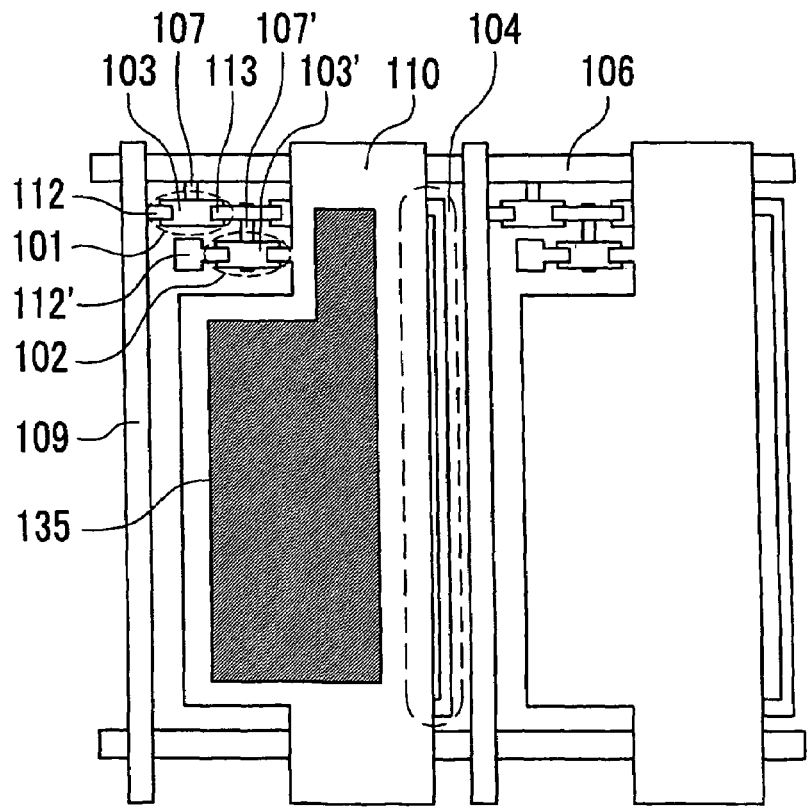
FIG. 6 is a plan view of the substantial part in an OLED according to the embodiment 3 of the present invention.

FIG. 6 is a plan view of the substantial part in an OLED according to the embodiment 3 of the present invention. TFTs of inverted-stagger structure are applied to this embodiment 3, where a 1st TFT 101 and a 2nd TFT are formed by the inverted-stagger structures, dissimilar to the previous embodiments 1 and 2. The reference numerals in the FIG. 6 denote the same meanings as those shown in FIG. 1. Hereinafter, a manufacturing method of the OLED according to the embodiment 3 will be explained.

First, a gate electrode 107 of the 1st TFT 101 and a gate electrode 107' of the 2nd TFT 102 are formed using TiW with thickness 50 nm by a sputtering and then patterned with prescribed patterns. Simultaneously to this process, a scan line 106 and a lower capacitor electrode 105 are patterned. Next, a gate insulating film 117 of $SiO_2$ with thickness 100 nm is formed. The $SiO_2$ film is formed by a plasma enhanced CVD (PECVD) using tetraethoxysilane as a source.

Next, a film of amorphous silicon (a-Si) with thickness 50 nm is formed using a LPCVD (Low Pressure CVD). Then the total area of the the a-Si film is laser-annealed and the a-Si film is crystallized to form a poly-crystalline Si (p-Si). Next, by patterning the p-Si using dry etching, an active layer 103 for the 1st transistor 101, an active layer 103' for the 2nd transistor 102 and an upper capacitor electrode 108 are formed. After that, a stopper film consisting of $SiO_2$ (not shown in the FIG. 6) is formed on the p-Si. This $SiO_2$ film is formed by a plasma enhanced CVD (PECVD) using tetraethoxysilane as a source and then patterned.

Next, ions of P are injected into the p-Si layer patterned by an ion-implantation method. The ions of P are not injected to the regions on which the stopper film is present. Then, active layers 103 and 103' are formed. After that, the glass substrate 116 is activated in an inert atmosphere ($N_2$) by heating so that the doping can be effectively carried out. On the glass substrate 116, a 1st insulating interlayer 118 of silicon nitride (SiNx) with thickness 200 nm is formed.

Next, contact holes are formed in the 1st insulating interlayer 118 on upper both ends of the active layers 103 and 103'.

Furthermore, another contact hole is formed in the gate insulating film 117 and the 1st insulating interlayer 118 on the upper side of the gate electrode 107' for the 2nd TFT. On the contact hole, Al film with thickness 500 nm is formed by a sputtering. Then, by a photolithographic process, a signal line 109 and a power line 110 are formed. Then, a source electrode 112 and a drain electrode 113 of the 1st TFT, and a source electrode 112' and a drain electrode 113' of the 2nd TFT are formed.

Then, the lower capacitor electrode 105 and the drain electrode 113 of the 1st TFT 101 are connected. The source electrode 112 of the 1st TFT 101 and the signal line 109, the drain electrode 113 of the 1st TFT and the gate electrode 107' of the 2nd TFT 102, and, the drain electrode 113' of the 2nd TFT and the power line 110 are connected. Finally, the upper capacitor electrode 108 is connected to the power line 110.

A 2nd insulating interlayer 119 of SiNx with thickness 500 nm is formed to cover the power line 110. A contact hole is formed on top of the source electrode 112' of the 2nd TFT. On the contact hole, using a sputtering, Al film with thickness 150 nm is formed and then a lower electrode 115 is formed by a photolithography.

As a 3rd insulating interlayer 120, by a spin coat using a positive type of protective film of light sensitive resin (for example, PC452, JSR Corporation), the 3rd insulating interlayer 120 is formed and baked. Preferably, the thickness of the 3rd insulating interlayer 120, consisting of the positive type of protective film of light sensitive resin (PC452), is 1 µm and is formed to cover the edge of the lower electrode 115 by about 3 µm.

The structure of the organic light-emitting element and the fabrication method of the protective layer are the same as those described in the previous embodiment 1.

The OLED according to the embodiment 3 of the present invention comprises the light-emitting unit 135 consisting of the lower electrode 115 formed only on the flat portion of the power line 110, the organic light-emitting layer 122 and the upper electrode 125. Therefore, by fabricating this structure, without forming a flattening layer on the light-emitting layer, there is no electric short circuit between the lower electrode 115 and upper electrode 125, while the short circuit is usually caused by the surface roughness of the stack.

Embodiment 4

Figure 7:
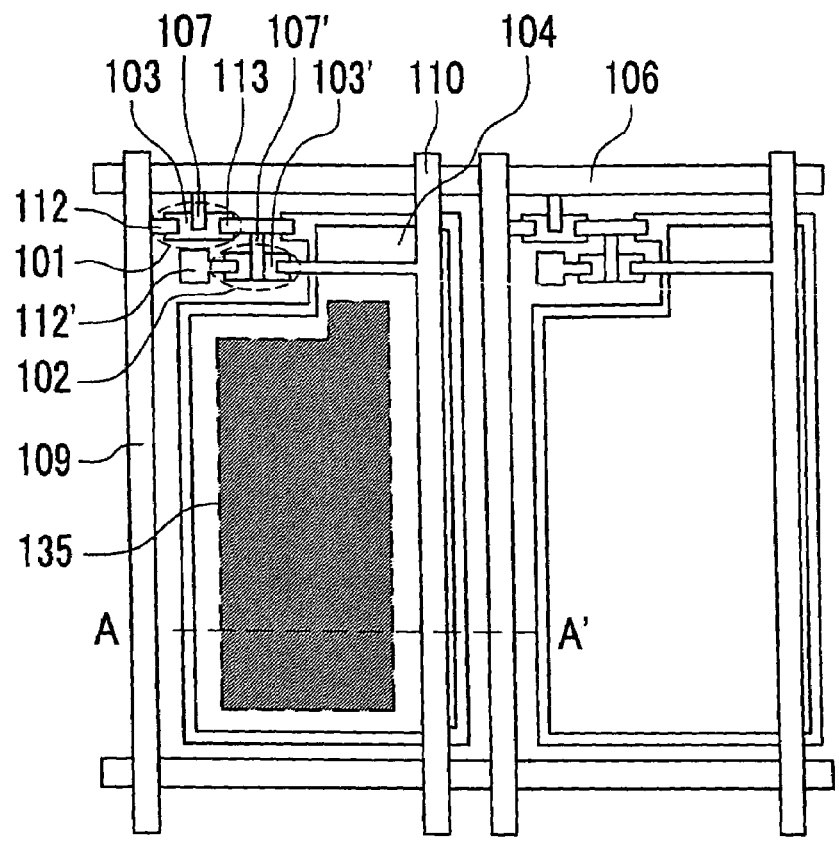
FIG. 7 is a plan view of the substantial part in an OLED according to the embodiment 4 of the present invention.
Figure 8:
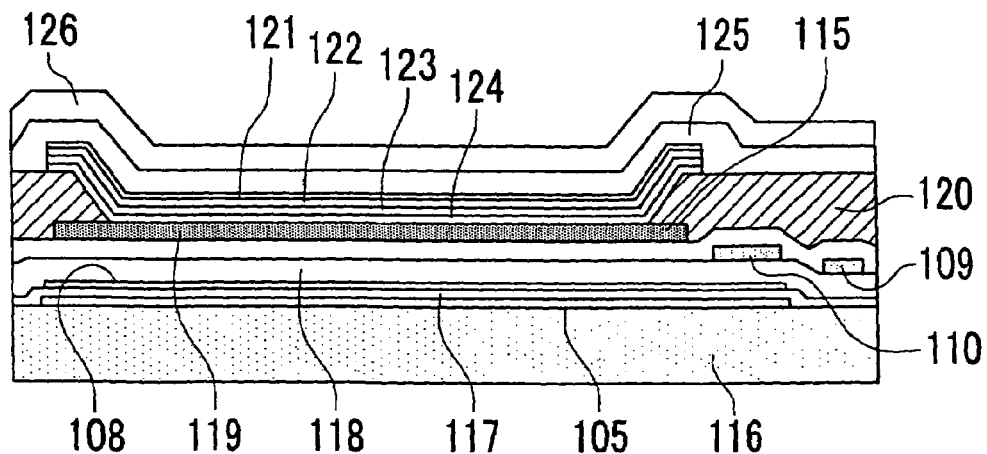
FIG. 8 shows a cross cut section of the region including a light-emitting element in the OLED taken along line A–A' of FIG. 1, according to the embodiment 4 of the present invention.

FIG. 7 is a plan view of the substantial part in an OLED according to the embodiment 4 of the present invention. FIG. 8 shows a cross cut section along line A–A' of the region including a light-emitting element in OLED corresponding to FIG. 1, according to the embodiment 4 of the present invention. The OLED of this embodiment 4 comprises an organic light-emitting element formed on a capacitor which forms a capacitance to hold a bias voltage for the TFT.

The OLED of this embodiment 4 comprises a plurality of light-emitting elements, each of which consists of an organic light-emitting layer 122, an upper electrode 125 and a lower electrode 115 sandwiching an organic light-emitting layer 122. This organic light-emitting element is the type of top emission where light is emitted from the organic light-emitting layer 122 and then the light is taken out from the upper electrode 125. A substantial light-emitting unit 135 of the organic light-emitting element is formed on an upper capacitor electrode 108. Hereinafter, a manufacturing method of this embodiment 4 is the same as that described in the previous embodiment 1.

As shown in FIG. 8, the OLED according to the embodiment 3 of the present invention comprises the light-emitting unit 135 consisting of the lower electrode 115, light-emitting layer and the upper electrode 125 only formed on the flat portion of the upper capacitor electrode 108 forming a capacitance to hold a bias voltage for the TFT to drive the light-emitting element. Therefore, by fabricating this structure, without forming a flattening layer on the light-emitting layer, there is no electric short circuit between the lower electrode 115 and upper electrode 125 while the short circuit is usually caused by the surface roughness of the stack.

Embodiment 5

Figure 9:
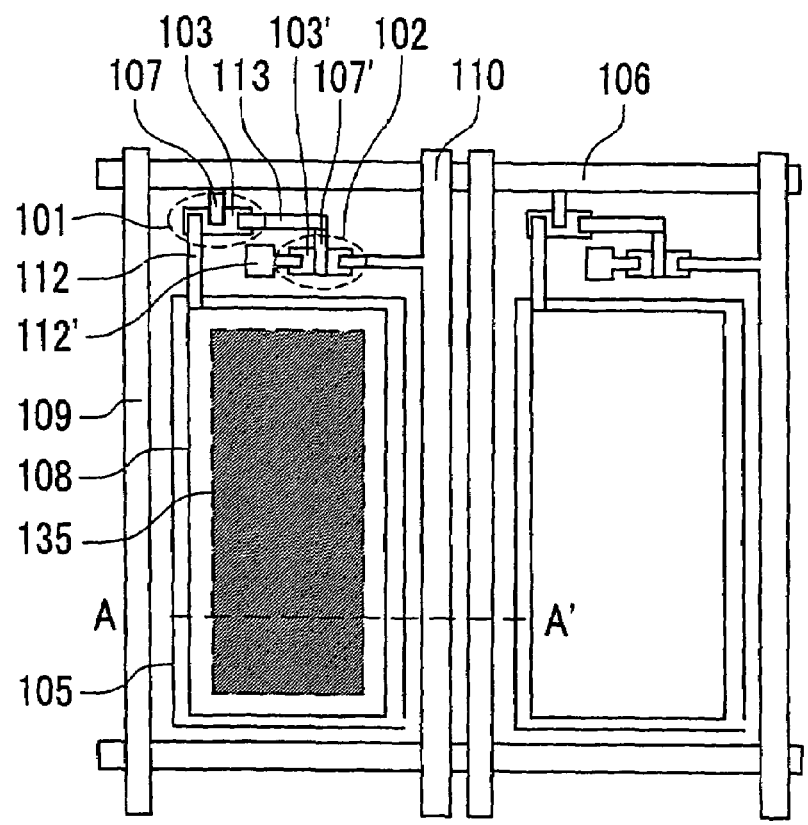
FIG. 9 is a plan view of the substantial part in an OLED according to the embodiment 5 of the present invention.
Figure 10:
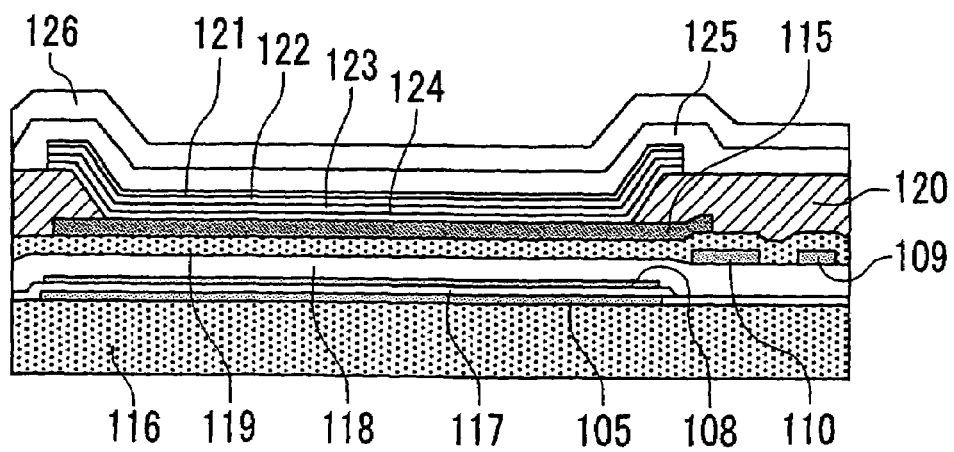
FIG. 10 shows a cross cut section of the region including a light-emitting element in the OLED taken along line A–A' of FIG. 1, according to the embodiment 4 of the present invention.
Figure 11:
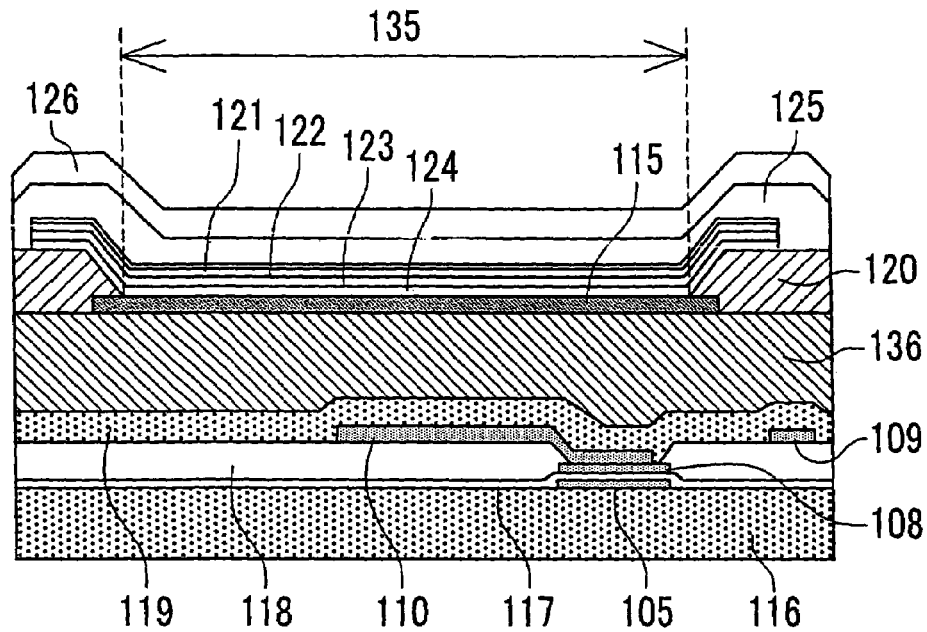
FIG. 11 is a sectional view of a structure of a pixel region in the conventional OLED showing the flattening layer formed on its underlying layer.
Figure 12:
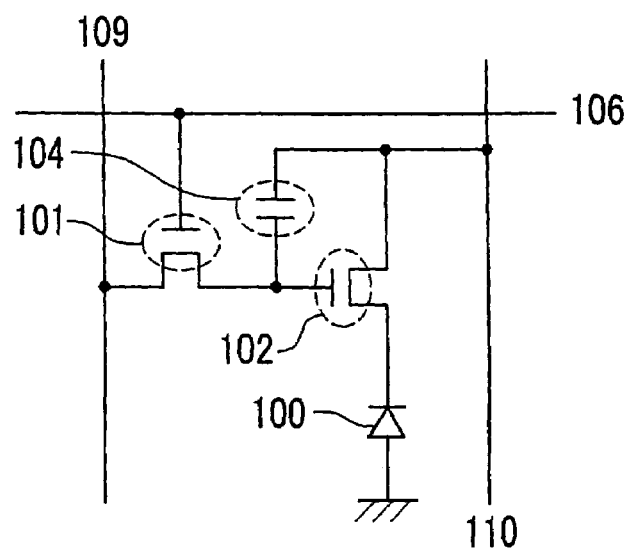
FIG. 12 is a schematic equivalent circuit diagram of a driving circuit for the organic light-emitting element in the OLED shown in FIG. 11.

FIG. 9 is a plan view of the substantial part in an OLED according to the embodiment 5 of the present invention. FIG. 10 shows a cross cut section of the region including a light-emitting element in the OLED taken along line A–A' of FIG. 1, according to the embodiment 4 of the present invention.

The OLED of this embodiment 5, differing to the embodiment 1, comprises an organic light-emitting element formed on the capacitor which forms a capacitance to hold the signal voltage for a TFT controlling a TFT to drive the organic light-emitting element.

Hereinafter, a manufacturing method of this embodiment 5 will be explained.

First, a film of amorphous silicon (a-Si) with thickness 50 nm is formed on a glass substrate 116 using LPCVD (Low Pressure CVD). Then the total area of the a-Si is laser-annealed and the a-Si is crystallized to form a poly-crystalline Si (p-Si). Next, by patterning the p-Si using dry etching, an active layer 103 for a 1st transistor 101, an active layer 103' for a 2nd transistor 102 and a lower capacitor electrode 105 are formed.

After that, a gate insulating film 117 of $SiO_2$ with thickness 100 nm is formed. $SiO_2$ film is formed by a PECVD using tetraethoxysilane (TEOS) as a source. Next, gate electrodes 107 and 107' of TiW with thickness 50 nm are formed using a sputtering and then patterned with prescribed patterns. Simultaneously to this process, a scan line 106 and an upper capacitor electrode 108 are patterned. Next, ions of P are injected into the patterned p-Si from the top of a gate insulating film 117 using an ion implantation. Here, the ions of P are not injected to the region where the gate electrodes 107 and 107' are formed. Thereby, active layers 103 and 103' are completed.

Next, the glass substrate 116 is activated in an inert atmosphere ($N_2$) by heating so that the doping can be effectively carried out. On the glass substrate 116, a 1st insulating interlayer 118 of silicon nitride ($SiN_x$) with thickness 200 nm is formed.

Next, contact holes are formed in the gate insulating film 117 and 1st insulating interlayer 118 on upper both ends of the active layers 103 and 103'. Furthermore, another contact hole is formed in the 1st insulating interlayer 118 on the upper side of the gate electrode 107' of the 2nd TFT. On the contact hole, Al film with 500 nm is formed by sputtering. Then by photolithographic process, a signal line 109 and a power line 110 are formed. After that, a source electrode 112 and a drain electrode 113 for the 1st TFT, and a source electrode 112' and a drain electrode 113' for the 2nd TFT are formed.

Then, the lower capacitor electrode 105 and the signal line 109 are connected. The source electrode 112 of the 1st TFT 101 and the upper capacitor electrode 108, the drain electrode 113 of the 1st TFT and the gate electrode 107' of the 2nd TFT 102, and, the drain electrode 113' of the 2nd TFT and the power line 110 are connected. Finally, the upper capacitor electrode 108 is connected to the power line 110.

A 2nd insulating interlayer 119 of $SiN_x$ with thickness 500 nm is formed to cover the power line 110. A contact hole is formed on top of the source electrode 112' for the 2nd TFT. On the contact hole, using a sputtering, Al film with thickness 150 nm is formed and then a lower electrode 115 is formed by a photolithography. Next, by spin coat using a positive type of protective film of light sensitive resin (for example, PC452, JSR Corporation), a 3rd insulating interlayer 120 is formed and baked. Preferably, the thickness of the 3rd insulating interlayer 120 consisting of a positive type of protective film of light sensitive resin (PC452) is 1 µm and is formed to cover the edge of the lower electrode 115 by about 3 µm.

The structure of the organic light-emitting element and the manufacturing method of the protective layer are the same as those described in the previous embodiment 1.

The OLED according to the embodiment 5 of the present invention comprises the light-emitting unit 135 consisting of the lower electrode 115, organic light-emitting layer 122 and the upper electrode 125 formed only on the flat portion of the upper capacitor electrode 108 forming a capacitance to hold a bias voltage for the TFT to drive the light-emitting element. Therefore, by fabricating this structure, without forming a flattening layer on the light-emitting layer, there is no electric short circuit between the lower electrode 115 and upper electrode 125, while the short circuit is usually caused by the surface roughness of the stack.

Having thus described several exemplary implementations of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. An actively driven OLED comprising:
   a substrate;
   a plurality of organic light-emitting elements provided above the substrate; and
   thin film transistors, having a power line, for driving the organic light-emitting elements,
   wherein
   the organic light-emitting elements comprises an organic light-emitting layer and a pair of electrodes sandwiching the organic light-emitting layer therebetween, and
   the power line of the thin film transistors has a convex and concave plane shape.

2. The actively driven OLED according to claim 1, wherein a part of the power line of the thin film transistors that is located over at least one line intersecting the power line of the thin film transistors has a concave plane shape.

3. The actively driven OLED according to claim 1, where a part of the power line of the thin film transistors that is located over at least one line intersecting the power line of the thin film transistors has a smaller plane shape than that of the other part of the power line.

4. The actively driven OLED according to claim 1, wherein the power line of the thin film transistors is provided between the organic light-emitting elements and the substrate.

5. The actively driven OLED according to claim 1, wherein one of the pair of electrodes is a transparent electrode.

* * * * *